(12) United States Patent
Mutoh et al.

(10) Patent No.: US 6,191,440 B1
(45) Date of Patent: Feb. 20, 2001

(54) CHARGE TRANSFER DEVICE WITH IMPROVED CHARGE DETECTION SENSITIVITY

(75) Inventors: Nobuhiko Mutoh; Takashi Nakano, both of Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/108,407

(22) Filed: Jul. 1, 1998

(30) Foreign Application Priority Data

Jul. 18, 1997 (JP) .................................................... 9-194243

(51) Int. Cl.[7] .................................................. H01L 29/768
(52) U.S. Cl. ............................................................ 257/239
(58) Field of Search .................................... 257/239, 250, 257/240; 377/60, 62, 59, 63, 61; 438/129, 60

(56) References Cited

U.S. PATENT DOCUMENTS 5,536,956 * 7/1996 Kawamoto et al. ................. 257/239

FOREIGN PATENT DOCUMENTS

| 57-27497 | 2/1982 | (JP) . |
| 57-86191 | 5/1982 | (JP) . |
| 6-252179 | 9/1994 | (JP) . |
| 7-176726 | 7/1995 | (JP) . |
| 7-202171 | 8/1995 | (JP) . |

* cited by examiner

*Primary Examiner*—Matthew Smith
*Assistant Examiner*—Calvin Lee
(74) *Attorney, Agent, or Firm*—Young and Thompson (57) ABSTRACT

In a charge transfer device, a floating gate is provided in an insulating film which is provided on a charge transfer channel layer. A buffer amplifier is connected with the floating gate, and detects signal charges in the charge transfer channel layer to generate a signal indicative of an output voltage corresponding to the signal charges. A bias gate is provided in the insulating film apart from the floating gate to cover at least a part of the floating gate. A bias applying unit applies a bias voltage to the bias gate in response to the output voltage signal such that an alternate current (AC) component of a voltage of the floating gate is substantially equal to an AC component of a voltage of the bias gate.

17 Claims, 9 Drawing Sheets

Fig. 10A $\Phi_1$
Fig. 10B $\Phi_2$
Fig. 10C $\Phi_R$

Fig. 11C

CHARGE TRANSFER DEVICE WITH IMPROVED CHARGE DETECTION SENSITIVITY

BACKGROUND OF THE INVENTION

1. Field of the Invention

The present invention relates to a charge transfer element. More particularly, the present invention relates to charge detection in a charge transfer device.

2. Description of the Related Art

A charge detector of a floating diffusion layer type and a charge detector of floating gate type are generally known as a charge detector applied to an output section of a charge transfer device.

In a case of the charge detector of the floating diffusion layer type, signal charges to be detected are accumulated in the floating diffusion layer provided in an output section. A voltage change of the floating diffusion layer because of the accumulation of the signal charges is amplified by a buffer amplifier provided within a chip, and outputted to an external device.

On the other hand, in a case of the charge detector of the floating gate type, the signal charges to be detected are accumulated in a transfer channel under a floating gate provided in an output section. A voltage change induced to the floating gate via a coupling capacity between a transfer channel and the floating gate because of the accumulation of the signal charges is amplified by a buffer amplifier, and outputted to an external device.

Typically, in the charge detector of the floating diffusion layer type, the floating diffusion layer is designed to have a small capacity so that a charge detection sensitivity or conversion efficiency can be improved when the signal charges are converted into an output voltage. However, there is a problem in that once the signal charges are detected, the signal charges can not be reproduced. That is, the detection is destructive detection. Also, noise referred to as a reset noise is generated.

On the other hand, the charge detector of the floating gate type typically has a smaller conversion efficiency than that of the charge detector of the floating diffused layer type. However, the charge detector of the floating gate type can detect signal charges without the destruction of the signal charges. Also, the charge detector of the floating gate type can prevent the reset noise from being generated at this time.

Figure 1:
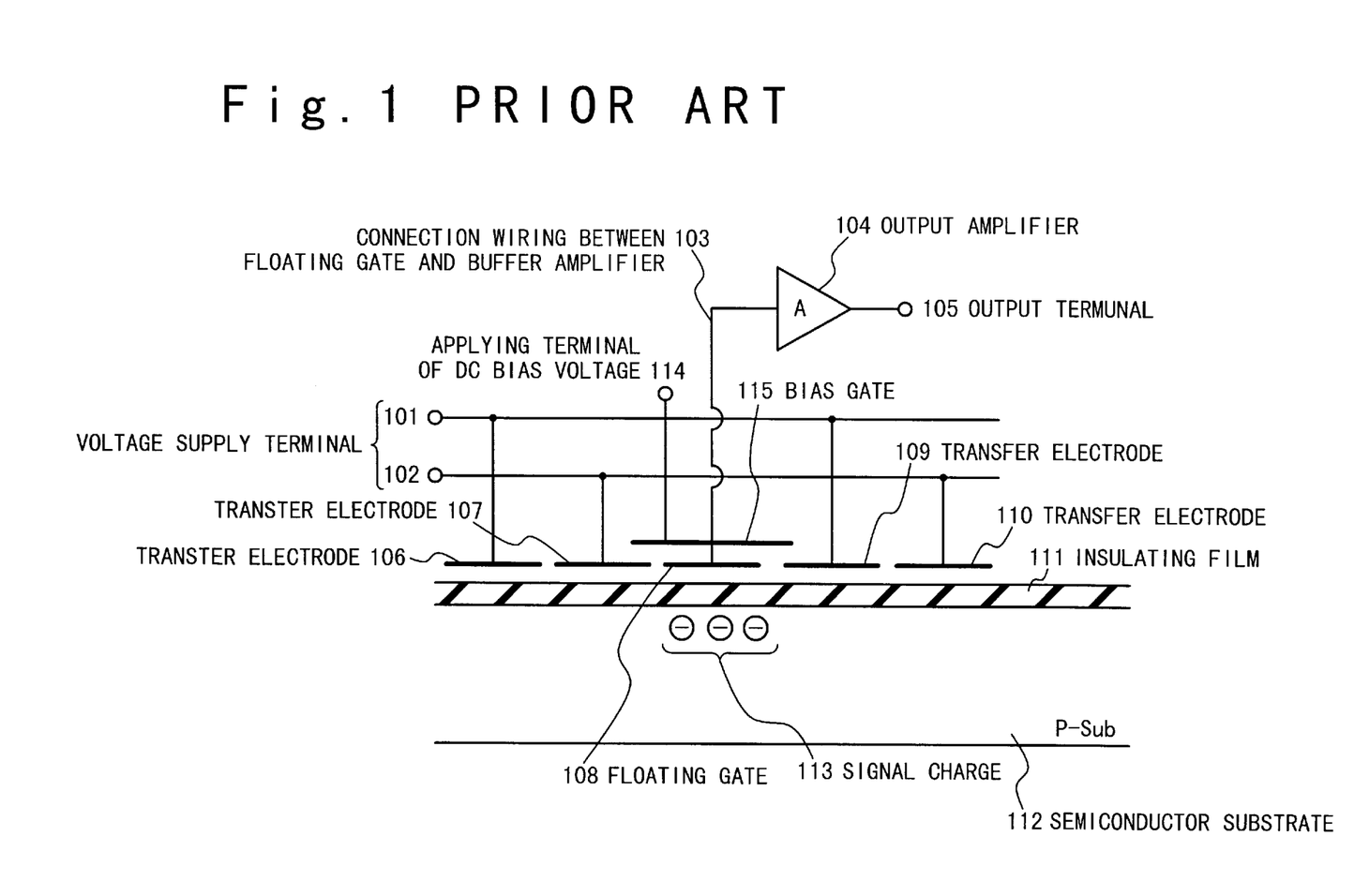
FIG. 1 is a block diagram showing a conventional charge transfer device of floating gate type.
Figure 2:
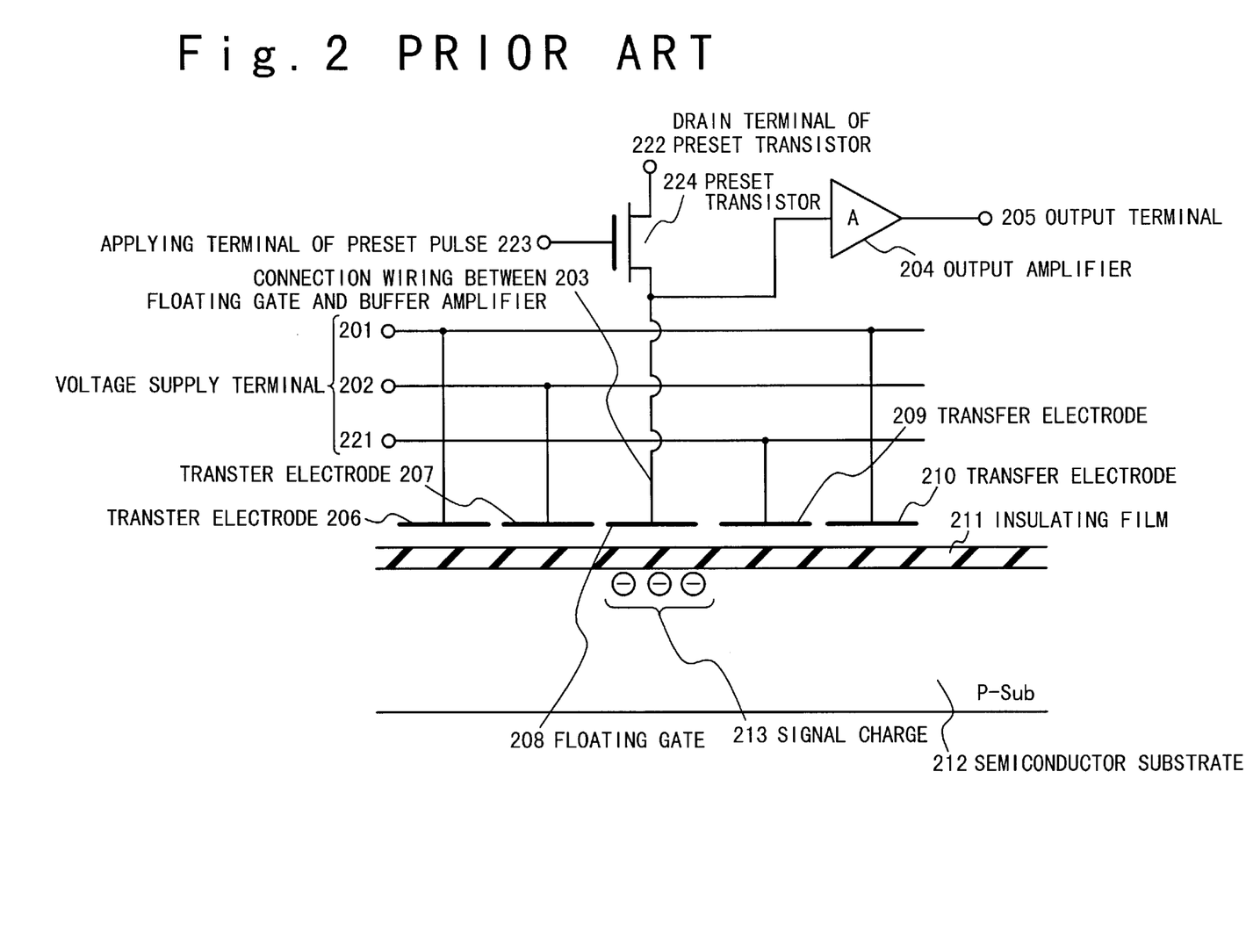
FIG. 2 is a block diagram showing another conventional charge transfer device of floating gate type.

FIGS. 1 and 2 are conventional charge detectors of the floating gate type shown in Japanese Laid Open Patent Applications (JP-A-Showa 57-27497 and JP-A-Showa 57-86191).

The charge detectors shown in FIGS. 1 and 2 are composed of terminals 101, 102, 201, 202 and 221 for respectively supplying drive voltages; transfer gates 106, 107, 109, 110, 206, 207, 209 and 210 of charge transfer elements; floating gates 108 and 208; output amplifiers 104 and 204; wirings 103 and 203 for connecting between the floating gate and the output amplifier; a direct current (DC) bias gate 115; a terminal 114 for applying a DC voltage to the DC bias gate; amplifier output terminals 105 and 205; insulating films 111 and 211; semiconductor substrates 112 and 212; signal charges 113 and 213; a preset transistor 224; a terminal 223 for applying a preset pulse to a gate of the transistor 224; and a drain terminal 222 of the transistor 224.

Figure 3A:
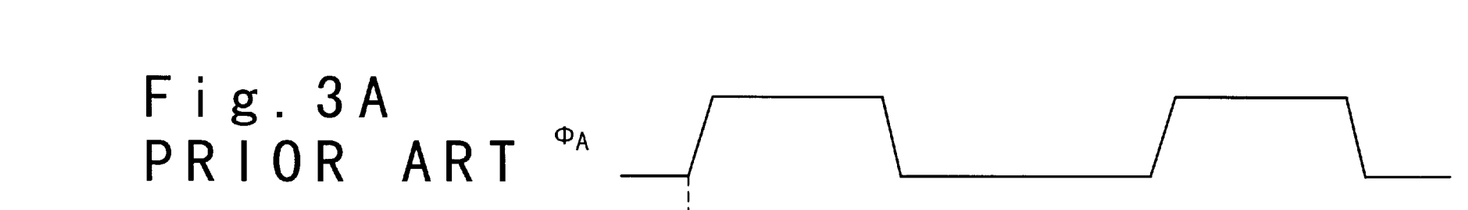
FIGS. 3A and 3B are timing charts of a driving pulses in the conventional charge transfer device shown in FIG. 1.
Figure 3B:
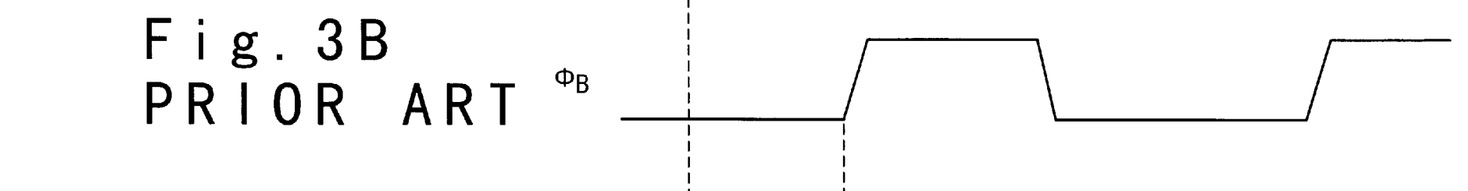
Figure 3C:
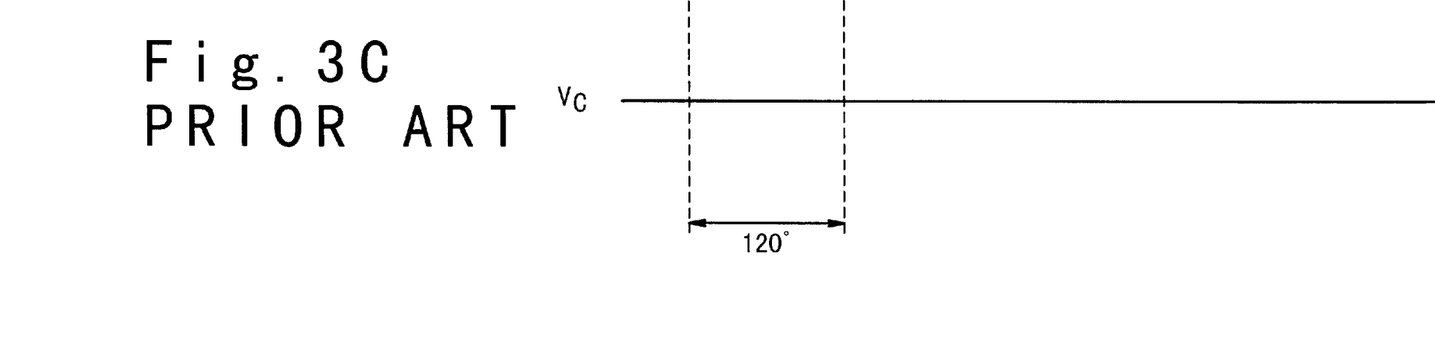
FIG. 3C is a timing chart of a voltage applied to voltage supply terminals.

The charge detector shown in FIG. 1 is driven by a (2+½)-phase driving system in response to a driving pulse shown in FIGS. 3A and 3B. A stage of a charge transfer device is composed of the three gates 106, 107 and 108. A pulse $\phi_A$ shown in FIG. 3A and a pulse $\phi_B$ shown in FIG. 3B, which are phase-shifted from each other by 120 degrees, are applied to the terminals 101 and 102. The offset level of the floating gate 108 is adjusted by applying a proper DC voltage $V_C$ to the bias gate 115 through the terminal 114 so that an offset level of the floating gate 108 is set to the approximate half of the above-mentioned pulse voltage in amplitude.

The signal charges are transferred in accordance with a usual charge transfer operation. The signal charges 113 are transferred to a region of a charge transfer channel layer directly beneath the floating gate 108. At this time, a voltage substantially proportional to the amount of signal charges is induced to the floating gate 108 via a coupling capacity between the signal charges and the floating gate 108. Then, the induced voltage is outputted through the output amplifier 105 to an external device as the output voltage. In this case, the signal charges are held in the charge transfer channel region directly beneath the floating gate, and never removed. Therefore, the signal charges can be transferred to a gate adjacent to the floating gate again. Thus, this charge detecting method is referred to as a non-destructively detecting method.

The charge detector shown in FIG. 2 is driven by a (3+½)-phase driving system. A stage of the charge transfer device is composed of the four gates 206, 207, 208 and 209. Pulse voltages, which are phase-shifted from each other by 90 degrees, are applied to the terminals 206, 207 and 209. The floating gate 208 is once set to a reference voltage by the preset transistor 224 before the signal charges are transferred. In this operation, a preset pulse is applied to the gate terminal 223 of the preset transistor 224 so that the preset transistor 224 is set to a conductive state. As a result, the bias voltage of the floating gate 208 is made equal to the reference voltage which is applied to the drain terminal 222.

The reference voltage is usually set to the approximately half of the above-mentioned driving pulse voltage. After this preset operation is completed, the preset transistor 224 is set to a non-conductive state, and thereby the floating gate 208 is electrically separated from the external device. Similarly to the charge detector shown in FIG. 1, the signal charges 213 are transferred to a region of a charge transfer channel which is located directly beneath the floating gate 208. At this time, a voltage substantially proportional to the amount of signal charges is induced to the floating gate 208 via a coupling capacity between the signal charges and the floating gate. Then, the induced voltage is outputted by the output amplifier 204 to an external device as an output voltage. This charge detecting method is also the non-destructively detecting method, similar to the charge detecting method of the charge detector shown in FIG. 1.

Figure 4:
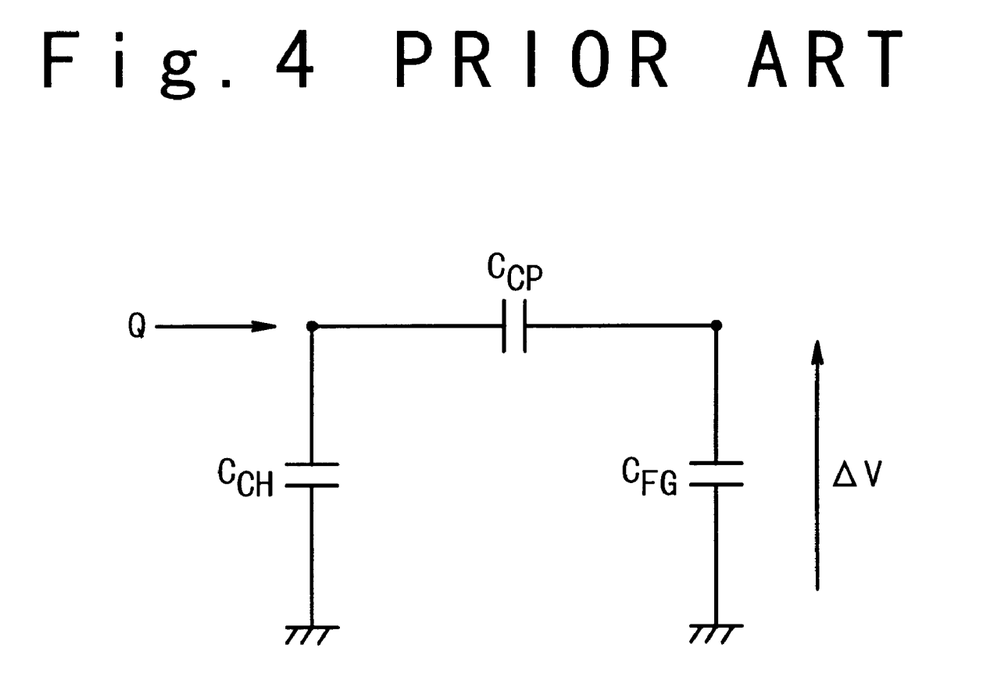
FIG. 4 is an equivalent circuit diagram of the conventional charge detector of floating gate type.

FIG. 4 shows a small signal equivalent circuit in the typical charge detector of the floating gate type. The equivalent circuit can be applied to both the charge detectors shown in FIGS. 1 and 2. In FIG. 4, $C_{CH}$ is a capacity between the charge transfer channel region directly beneath the floating gate and the ground. Also, $C_{CP}$ is a coupling capacity between the floating gate and the charge transfer channel region directly beneath the floating gate. In addition, $C_{FG}$ is a capacity between the floating gate and the ground. The capacity $C_{FG}$ includes all the parasitic capacities to the floating gate, such as the capacity of the wire for connecting the floating gate and the output amplifier, the input capacity of the output amplifier.

Now, it is assumed that the amount of signal charges to be transferred is Q. In this case, a signal voltage ΔV induced to the floating gate is given by the following equation.

$$V=Q/C_S$$

$$C_S=C_{CH}+C_{FG}+C_{CH}\times C_{FG}/C_{CP}$$

Hereafter, the capacity $C_S$ represented by the above equation is referred to as a charge detection capacity.

In order to reduce the charge detection capacity of the charge detector of the floating gate type so that a charge detection sensitivity can be improved, it is necessary to reduce the capacity $C_{CH}$ and the capacity $C_{FG}$. In addition, it is necessary to increase the coupling capacity $C_{CP}$ between the floating gate and the channel region directly beneath the floating gate.

However, even if the size of the floating gate is decreased so as to reduce the capacities $C_{CH}$ and $C_{FG}$, there is a limitation on a manufacturing condition. Moreover, even if a process for forming thin films is performed for the film which is located directly beneath the floating gate so as to increase the capacity $C_{CP}$, there is also a limitation on the manufacturing condition. Especially, the capacity between the floating gate 108 and the DC bias gate 115 in the charge transfer device shown in FIG. 1 acts to increase a parasitic capacitance to the capacity $C_{FG}$. Also, the capacity of the source region of the preset transistor 224 connected with the floating gate in the charge transfer device shown in FIG. 2 acts to increase the parasitic capacitance to the capacity $C_{FG}$. As a result, this obstructs the improvement of the charge detection sensitivity.

A signal charge detecting device is described in Japanese Laid Open Patent Application (JP-A-Heisei 6-252179). In this reference, a gate electrode of the first stage MOS transistor, a floating diffusion layer and a floating wiring for a floating region 24 are all electrically shielded by a shield wiring 32 connected to a source of the first stage MOS transistor. As a result, it is prevented that distortion is brought about into an output of the signal charge detecting device.

A charge transfer device is described in Japanese Laid Open Patent Application (JP-A-Heisei 7-202171). In this reference, an N-type impurity layer 4 as a charge transfer region and an N$^+$-impurity region as a reset drain 16 are provided on a p-type silicon substrate 3. Also, transfer electrodes 6 to 10, output gates 11 and 12, a floating gate 13, a reset gate 14 are provided on the substrate via an insulating film 5. The floating gate 13 is connected to a gate of an output transistor 17. In addition, a shield electrode 19 which is connected to the N-type impurity layer 4 covers the floating gate 13.

SUMMARY OF THE INVENTION

The present invention is accomplished in view of the above problems. Therefore, an object of the present invention is to provide a charge transfer device, which solves the above-mentioned problems and includes a charge detector of floating gate type having a high detection sensitivity.

In order to achieve an aspect of the present invention, a charge transfer device includes a floating gate provided in an insulating film which is provided on a charge transfer channel layer, a buffer amplifier connected with the floating gate, for detecting signal charges in the charge transfer channel layer to generate a signal indicative of an output voltage corresponding to the signal charges, a bias gate provided in the insulating film apart from the floating gate to cover at least a part of the floating gate, and a bias applying unit for applying a bias voltage to the bias gate in response to the output voltage signal such that an alternate current (AC) component of a voltage of the floating gate is substantially equal to an AC component of a voltage of the bias gate.

The voltage applying unit includes a direct current bias voltage power supply for outputting a direct current (DC) voltage, and a bias feedback circuit for applying the bias voltage in which the DC voltage is added to the output voltage of the buffer amplifier, as the bias voltage, to the bias gate.

The bias feedback circuit may include a capacitor element connected with an output of the buffer amplifier, and a resistor element provided between the DC bias voltage power supply and the capacitor element. In this case, a voltage between the resistor element and the capacitor element is applied to the bias gate as the bias voltage.

Alternatively, the bias feedback circuit may include an amplifier connected with an output of the buffer amplifier and having an amplification factor equal to an inverse number of that of the buffer amplifier, a capacitor element connected with an output of the amplifier, and a resistor element provided between the DC bias voltage power supply and the capacitor element. A voltage between the resistor element and the capacitor element is applied to the bias gate as the bias voltage.

The floating gate is arranged such that the floating gate does not overlap with a plurality of transfer gates, an output gate and a reset gate, in a direction perpendicular to said charge transfer direction.

The charge transfer device may further include transfer gate sets formed in the insulating film, composed of a plurality of transfer gates, for transferring the signal charges in response to a first clock signal and a second clock signal. The plurality of transfer gates may be arranged in a transfer direction of the signal charges such that the plurality of transfer gates are not overlapped with each other in a direction perpendicular to the charge transfer direction. Also, every adjacent two of the plurality of transfer gates constitute one of the transfer gate sets, and the first clock signal and the second clock signal which are complementary to each other are alternately supplied to the transfer gate sets. The charge transfer device may further include a clock signal generator for supplying the first clock signal and the second clock signal which are complementary to each other.

The charge transfer channel layer is an N-type buried channel, and includes an N$^-$region formed under at least one of the plurality of transfer gates in the charge transfer channel layer. Also, the charge transfer device may further include a reset gate provided in the insulating layer to control timing at which the signal charges are transferred from a region of the charge transfer channel layer under the floating gate to a reset drain. In this case, a reset drain provided behind the reset gate in the charge transfer direction in the charge transfer channel layer by application of a DC bias voltage to control timing at which the signal charges are transferred from a region of the charge transfer channel layer under the floating gate to a reset gate.

Also, the charge transfer device may further include an output gate provided between the transfer gate sets and the floating gate in the insulating film to control timing at which the signal charges are transferred to a region of the charge transfer channel layer under the floating gate. In addition, the bias gate is provided to cover an entire surface other than a bottom surface of the floating gate.

In order to achieve another aspect of the present invention, a method for transferring and detecting signal charges, includes the steps of:

transferring signal charges to a region of a charge transfer channel layer under a floating gate;

applying a bias voltage to the bias gate, such that an alternate current (AC) component of a voltage of the floating gate is substantially equal to an AC component of a voltage of the bias gate;

detecting the signal charges transferred in the charge transfer channel layer by use of the floating gate to generate an output signal; and controlling the bias voltage in response to the output signal.

Description of the Preferred Embodiments

Next, a charge transfer device of the present invention will be described below in detail with reference to the attached drawings.

Figure 5:
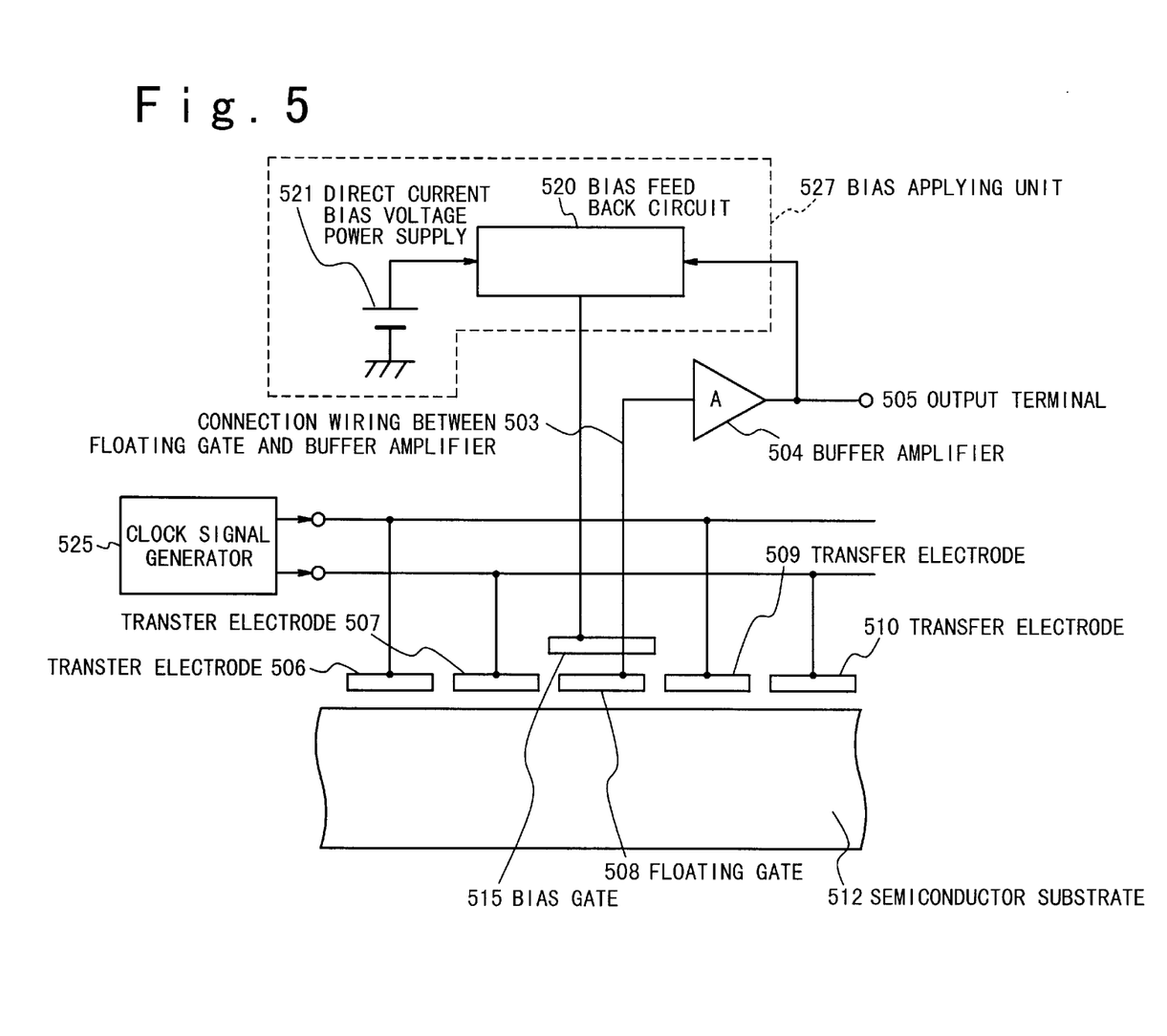
FIG. 5 is a block diagram showing a charge transfer device of the present invention.

FIG. 5 shows the structure of the charge transfer device of the present invention. Referring to FIG. 5, the charge transfer device of the present invention will be described.

The charge transfer device is composed of a semiconductor substrate 512, transfer gates or electrodes 506, 507, 509 and 510 and a floating gate 508. The charge transfer device is further composed of a buffer amplifier 504, a connection wiring 503 between the floating gate 508 and the buffer amplifier 504, an output terminal 505 of the buffer amplifier 504, a bias applying unit 527, and a clock signal generator 525.

The bias applying unit 527 is provided with a DC bias voltage power supply 521 and a bias feedback circuit 520. The bias feedback circuit 520 has a function of superimposing the output voltage of the buffer amplifier 504 on a DC voltage supplied from the DC bias voltage power supply 521 and then applying the superimposed voltage to the bias gate 515. The bias feedback circuit 520 may be formed in an on-chip manner or an off-chip manner. The DC bias voltage power supply 521 shown in FIG. 5 is a positive voltage power supply 521. However, the DC bias voltage power supply 521 may be a negative voltage power supply.

It is necessary that the charge detector of the floating gate type is composed of means for adjusting the bias voltage applied to the bias gate 515. However, in the present invention, the voltage of the bias gate 515 can be set to a suitable voltage by adjusting the voltage outputted from the DC bias voltage power supply 521. Also, in the charge transfer device according to the present invention, a positive feedback signal from the floating gate 508 through the buffer amplifier 504 is superimposed on the DC bias voltage from the DC bias voltage power supply 521. Thus, the capacitance between the floating gate 508 and the bias gate 515 does not function as a parasitic capacitance of the floating gate 508. As a result, the parasitic capacitance of the floating gate 508 can be reduced to thereby improve the charge detection sensitivity.

Figure 6:
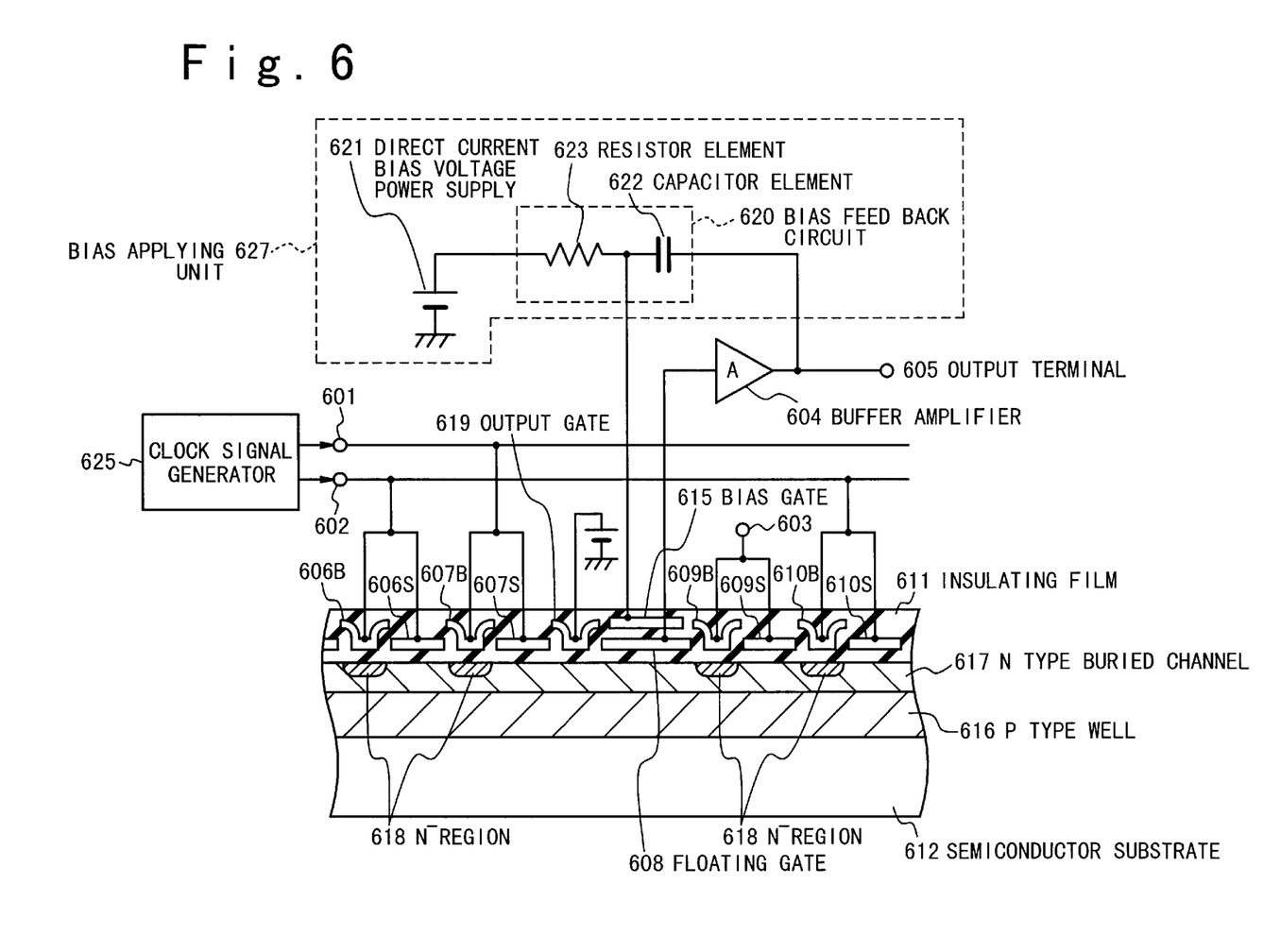
FIG. 6 is a block diagram showing a first embodiment of the charge transfer device according to the present invention.

FIG. 6 shows the structure of the charge transfer device having the charge detector of the floating gate type according to the first embodiment of the present invention. Referring to FIG. 6, an N-type buried channel 617 as a charge transfer channel layer is provided in a P-type well 616 on an N-type semiconductor substrate 612. Transfer gates or electrodes 606B, 606S, 607B, 607S, 609B, 609S, 610B and 610S of the charge transfer device are provided in an insulating film 611. The transfer gates 606B and 606S, 607B and 607S, 609B and 609S, 610B and 610S form sets of transfer gates. In order to form a well structure within a charge transfer channel layer 617 under the insulating film 611, N$^-$-regions 618 are formed within the charge transfer channel layer 617 under the particular transfer gates 606B, 607B, 609B and 610B. Driving voltages are supplied to terminals 601, 602 and 603. Thus, well structure generation control is performed to each set of transfer gates, so that the signal charges can be transferred. Hence, a two-phase driving system is accomplished in the first embodiment.

As for the arrangement of transfer gates, an output gate 619 and a floating gate 608 are provided between the transfer gates 607S and 609B, and the bias gate 615 is provided in the insulating film 611 over the floating gate 608. A voltage change of the floating gate 608 is outputted from the output terminal 605 via the buffer amplifier 604 to an external device.

The bias applying unit 627 is provided with the DC bias voltage power supply 621 and the bias feedback circuit 620, as described above. The bias feedback circuit 620 is composed of a cascaded connection of a capacitor element 622 connected to an output of the buffer amplifier 604 and a resistor element 623 disposed between the DC bias voltage power supply 621 and the capacitor element 622. A connection point between the capacitor element 622 and the resistor element 623 is connected to the bias gate 615.

A manufacturing method in the first embodiment will be described below. An impurity concentration of the N-type semiconductor substrate 612 is approximately $1 \times 10^{14}$ to $5 \times 10^{14}/cm^3$. The junction depth of the P-type well 616 is approximately 2 to 3 μm, and the impurity concentration is approximately $1 \times 10^{15}$ to $1 \times 10^{16}/cm^3$. The junction depth of the N-type buried channel 617 is approximately 0.3 to 0.5 μm, and the impurity concentration is $5 \times 10^{16}$ to $1 \times 10^{17}/cm^3$.

The transfer gates 606S, 607S, 609S and 610S and the floating gate 608 are formed of polysilicon as a first layer of gates. The transfer gates 606B, 607B, 609B and 610B, the output gate 619 and the bias gate 615 are formed of polysilicon as a second layer of gates. An gate length of each of the transfer gates is approximately 2 to 5 μm, and an gate length of the floating gate 608 is approximately 5 to 10 μm. A film thickness of each of the transfer gates, the floating gate 608 and the bias gate 615 is approximately 200 to 400 nm.

Portions of the insulating film 611 between the semiconductor substrate 612 and the transfer gate and between the semiconductor substrate 612 and the floating gate 608 are formed of a silicon oxide film having the film thickness of 50 to 100 nm. Another portion of the insulating film 611 between the floating gate 608 and the bias gate 615 is also formed of the silicon oxide film having the film thickness of 100 to 200 nm. The transfer gates adjacent to each other are overlapped in this embodiment. A gap between the transfer gates is substantially set to a film thickness of the interlayer insulating film 611 between the transfer gates.

The buffer amplifier 604 is composed of a source follower amplifier, and has an amplification factor of about 0.7. The capacitance C of the capacitor element 622 and the resistance R of the resistor element 623, both of which constitute the bias feedback circuit 620. The CR time constant defined by the multiplication between the capacitor C and the resistance R is set to a value several times or more longer than the drive period of the charge transfer device. Actually, for a charge transfer device driven at the frequency of 10 MHz, namely, at the drive period of 100 nsec, the capacitance C is set to approximately 5 pF, and the resistance R is set to approximately 1 MΩ.

As mentioned above, the bias feedback circuit 620 has a function to superimpose the output from the buffer amplifier 604 on a DC voltage from the DC voltage power supply 621 and then to apply the superimposed voltage to the bias gate 615. This function allows the bias feedback circuit 620 to apply to the bias gate 615 the voltage in which the feedback signal from the buffer amplifier 604 is superimposed on the DC voltage suitable for the control of the bias voltage to the floating gate 608.

Figures 7A, 7B, 7C:
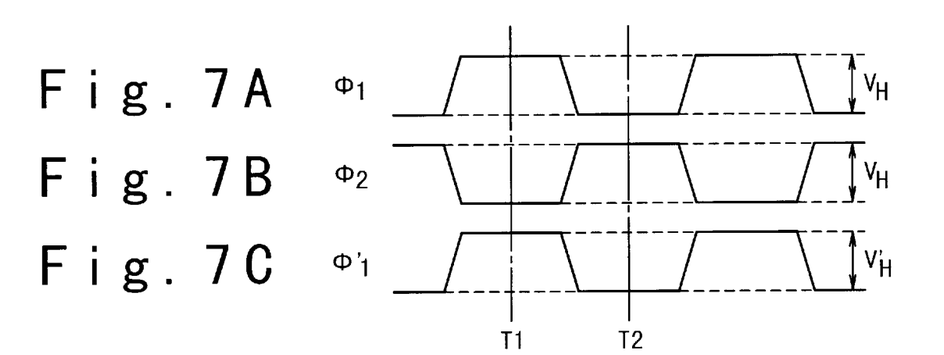
FIGS. 7A to 7C are timing charts of driving pulses used in the charge transfer device shown in FIG. 6.
Figures 8A, 8B:
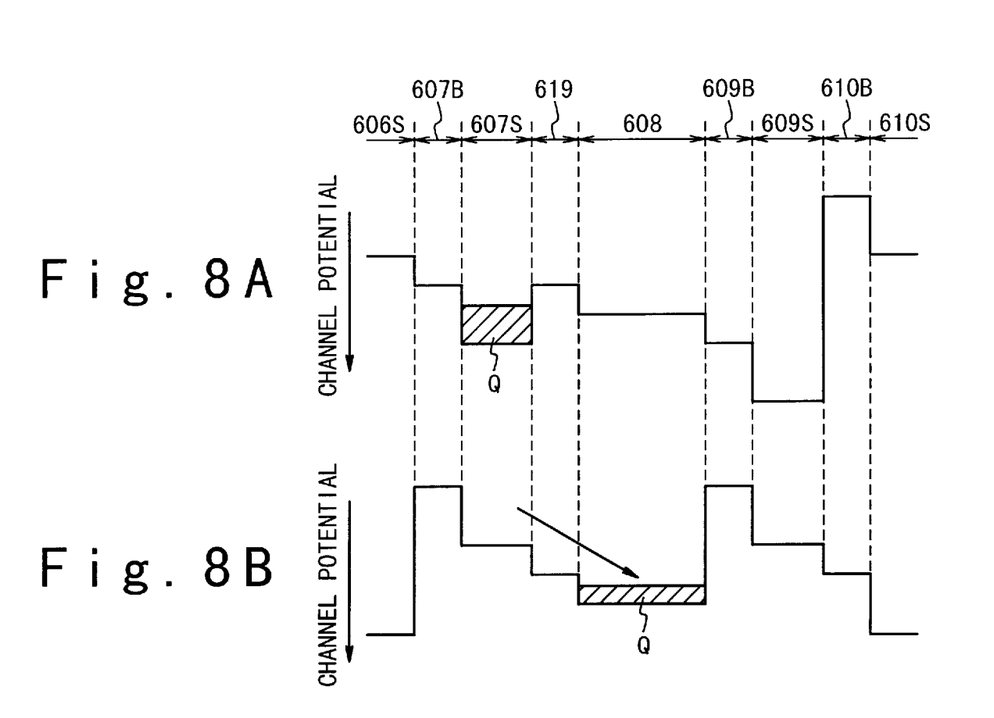
FIGS. 8A and 8B are diagrams showing potential distributions on a channel along a charge transfer direction at times T1 and T2 in FIGS. 7A to 7C, respectively.

Operations of the charge transfer device in the first embodiment will be described below. FIGS. 7A to 7C show timing charts of the driving pulses $\phi_1$, $\phi_2$ and $\phi_1'$ used in the charge transfer device shown in FIG. 6. FIGS. 8A and 8B show diagrams showing the potential distributions on the channel along a charge transfer direction at times T1 and T2, respectively. The charge transfer is performed by use of a 2-phase driving system. The driving pulses $\phi_1$, $\phi_2$ and $\phi_1'$ are applied to the terminals 601, 602 and 603 from the clock signal generator 625, respectively. The driving pulses $\phi1$ and $\phi2$ are complementary pulses, which are same in amplitude, phase-shifted from each other by 180 degrees and have a duty (pulse ratio) of 50%.

The amplitude $V_H'$ of the driving pulse $\phi_1'$ is set to be larger than an amplitude $V_H$ of the driving pulse $\phi_1$ or $\phi_2$. The phase and duty of the driving pulse $\phi_1'$ are equal to those of the driving pulse $\phi_1$. As shown in FIGS. 8A and 8B, the signal charges accumulated in a region of the charge transfer channel layer 617 directly beneath the gate 607S at the time T1 are transferred to a region of the charge transfer channel layer 617 directly beneath the floating gate 608S at the time T2.

According to the diagrams showing the potential distributions on the channel shown in FIGS. 8A and 8B, a predetermined DC voltage is applied to the output gate 619. As a result, a well structure necessary for the accumulation of the signal charges in the region of the charge transfer channel layer 617 directly beneath the gate 607S can be formed within the charge transfer channel layer 617 under the output gate 619 at the time T1. Also, the formation of the well structure can be prevented, when the signal charges are transferred from the charge transfer channel layer 617 region directly beneath the gate 607S to the charge transfer channel layer 617 region directly beneath the floating gate 608, at the time T2. A voltage of the DC bias voltage power supply 621 is set in such a manner that a potential in the charge transfer channel layer 617 region directly beneath the floating gate 608 is at least deeper than a potential at the charge transfer channel layer 617 region directly beneath the output gate 619. As a result, the signal charges can be accumulated in the charge transfer channel layer 617 region directly beneath the floating gate 608 at the time T2.

If the signal charges are accumulated in the charge transfer channel layer 617 region directly beneath the floating gate at the time T1, the amplitude $V_H'$ of the driving pulse $\phi_1'$ is set to an amplitude at which all the signal charges can be transferred to the charge transfer channel layer 617 region directly beneath the gates 609S.

When the signal charges are transferred to the charge transfer channel layer 617 region directly beneath the floating gate 608, a voltage substantially proportional to the amount of signal charges is induced to the floating gate 608 through the coupling capacity between the signal charges and the floating gate 608. Then, the voltage change is outputted by the buffer amplifier 604 to the external device as the output voltage. At this time, the signal charges accumulated in the charge transfer channel layer 617 region directly beneath the floating gate 608 are held without removal so that the signal charges can be completely transferred to a charge transfer channel layer 617 region directly beneath the gate adjacent thereto. Thus, this charge detecting method is the non-destructively detecting method.

Advantageous effects of the charge transfer device in the first embodiment will be described below. Considering an alternate current (AC) component of the output voltage from the buffer amplifier 604, a component that is 0.7 times larger than the voltage change at the floating gate 608 is applied to the bias gate 615 as the feedback signal. Thus, the capacitance between the floating gate 608 and the bias gate 615, which may be originally the parasitic capacitance acting to reduce the charge detection sensitivity, is apparently reduced by 70%.

Moreover, the preset transistor 224 used in the conventional example as shown in FIG. 2 is not required. Thus, the increase of the parasitic capacitance because of the addition of the preset transistor 224 can be eliminated. As a result, this advantageous effect can reduce the charge detection capacitance by approximately 15% and equivalently improve the charge detection sensitivity by approximately 18%, as compared with the conventional example in which the preset transistor 224 is added.

Figure 9:
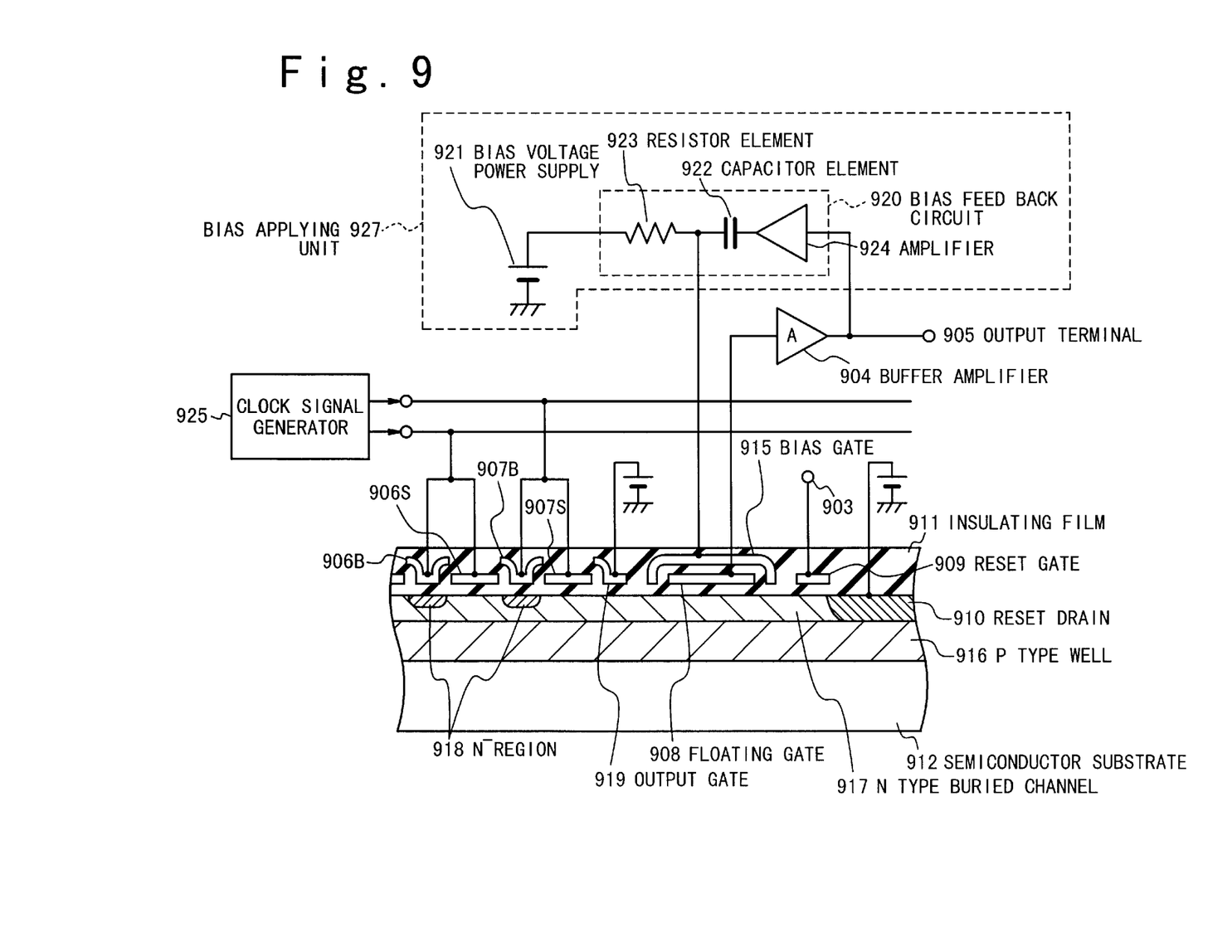
FIG. 9 is a block diagram showing the charge transfer device according to a second embodiment of the present invention.

FIG. 9 shows the charge transfer device having the charge detector of the floating gate type according to the second embodiment of the present invention. Referring to FIG. 9, an N-type buried channel 917 as a charge transfer channel layer is provided in a P-type well 916 on an N-type semiconductor substrate 912. The transfer gates 906B, 906S, 907B and 907S are provided in the insulating film 911 to form sets of transfer gates. In order to form the well structure within the charge transfer channel layer 917 under the insulating film 911, N⁻ type regions 918 are provided in the charge transfer channel layer 917 under the particular transfer gates 906B and 907B. In addition, the well structure control is performed for each set of transfer gates. Hence, the two-phase driving system is used in the second embodiment.

As to the arrangement of the gates, an output gate 919, a floating gate 908, a reset gate 909 and a reset drain 910 are provided in the order subsequent to the transfer gate 907S in the charge transfer direction. A bias gate 915 is provided over the floating gate 908 in the insulating film 911. The voltage change of the floating gate 908 is outputted from an output terminal 905 by a buffer amplifier 904 to an external device.

The bias applying unit 927 is provided with a DC bias voltage power supply 921 and a bias feedback circuit 920. The bias feedback circuit 920 is composed of the cascaded connection of an amplifier 924, a capacitor element 922 and a resistor element 923. The amplifier 924 is connected to the output of the buffer amplifier and has an amplification factor equal to an inverse number of an amplification factor of the buffer amplifier 904. The capacitor element 922 is connected to the output of the amplifier 924 and the resistor element 923. The resistor element is also connected to the DC bias voltage power supply 921. A connection point between the capacitor element 922 and the resistor element 923 is connected to the bias gate 915.

A manufacturing method of the charge transfer device in this second embodiment will be described below. An impurity concentration of the N-type semiconductor substrate 912 is approximately $1 \times 10^{14}$ to $5 \times 10^{14}/cm^3$. The junction depth of the P-type well 916 is approximately 2 to 3 $\mu$m, and the impurity concentration is approximately $1 \times 10^{15}$ to $1 \times 10^{16}/cm^3$. The junction depth of the N-type buried channel 917 is approximately 0.3 to 0.5 $\mu$m and the impurity concentration is $5 \times 10^{16}$ to $1 \times 10^{17}/cm^3$.

The transfer gates 906S, 907S, the floating gate 908 and the reset gate 909 are formed of polysilicon as a first layer of gates. The transfer gates 906B, 907B, the output gate 919 and the bias gate 915 are also formed of polysilicon as a second layer of gates. The gate length of each of the transfer gates is approximately 2 to 5 $\mu$m, and the gate length of the floating gate 908 is approximately 5 to 10 $\mu$m. The gate length of the reset gate 909 is approximately 3 to 5 $\mu$m. The film thickness of each of the transfer gates, the floating gate 908, the reset gate 909 and the bias gate 915 is approximately 200 to 400 nm. The insulating film 911 is formed of silicon oxide films, and the film thickness thereof is 50 to 100 nm. A portion of the insulating film 911 between the floating gate 908 and the bias gate 915 is also formed of a silicon oxide film, and the film thickness thereof is 100 to 200 nm. The charge transfer device in the second embodiment is different in the following points from the first embodiment shown in FIG. 6. That is, the bias gate 915 is provided to cover the entire surface except the bottom of the floating gate 908, as shown in FIG. 9. However, the output gate 919 and the floating gate 908 are not overlapped with each other. Also, floating gate 908 and reset gate 909 are not overlapped with each other. The gap of approximately 0.5 $\mu$m is formed between the gates which are not overlapped with each other.

The buffer amplifier 904 is composed of the source follower amplifier, and the amplification factor thereof is approximate 0.7. The amplification factor of the amplifier 924 which is an element of the bias feedback circuit 920 is set to approximately 1.4 which is equal to the inverse number of 0.7. As for a capacitance C of the capacitor element 922 and a resistance R of the resistor element 923, the capacity C is set to approximately 5 pF, and the resistance R is set to approximately 1 MΩ, in the charge transfer device driven at the frequency of 10 MHz, namely, at the period of 100 nsec., similarly to those of the embodiment shown in FIG. 6.

Figure 10A:
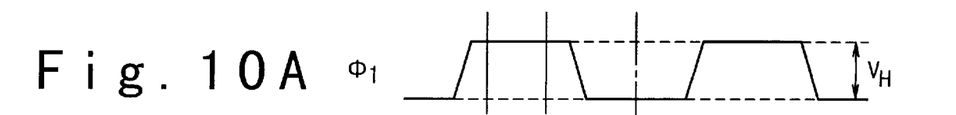
FIGS. 10A to 10C are timing charts of driving pulses in the charge transfer device shown in FIG. 9.
Figure 10B:
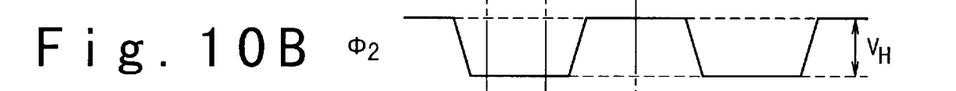
Figure 10C:
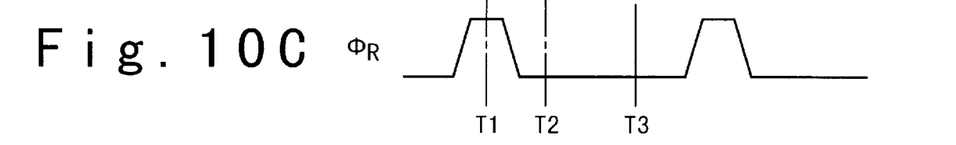
Figure 11A:
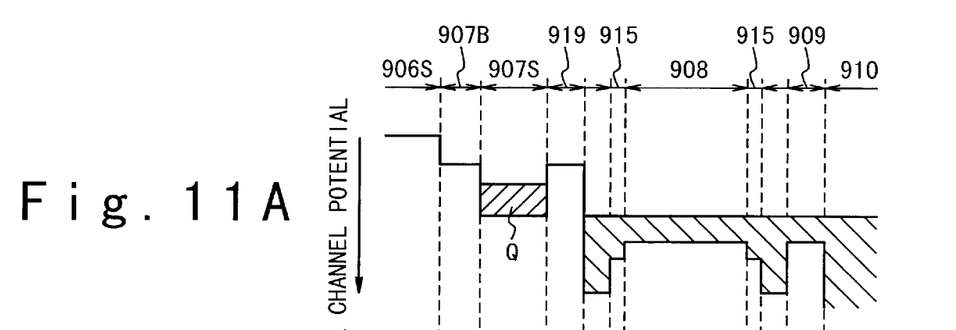
FIGS. 11A to 11C are diagrams showing potential distributions on a channel along a charge transfer direction at time T1, T2 and T3 in FIGS. 10A to 10C, respectively.
Figure 11B:
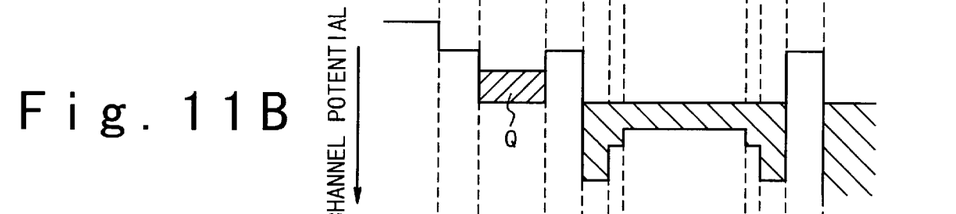
Figure 11C:
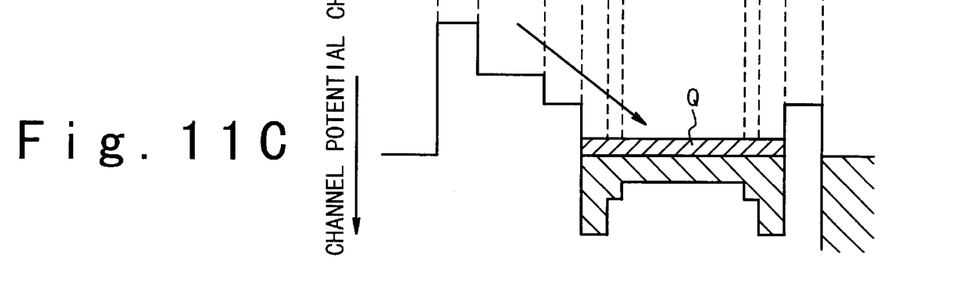

The operation of the charge transfer device in the second embodiment will be described below. FIGS. 10A to 10C show timing charts of the driving pulses $\phi_1$, $\phi_2$ and $\phi_R$ used in the charge transfer device shown in FIG. 9. FIGS. 11A to 11C show diagrams showing the potential distributions on the channel along a charge transfer direction at times T1, T2 and T3, respectively. The charge transfer is performed by use of the 2-phase driving system.

The driving pulses $\phi1$, $\phi2$ and $\phi R$ are applied to terminals 901, 902 and 903 by a clock signal generator 925, respectively. The driving pulses $\phi1$ and $\phi2$ are the complementary pulses, which are same in amplitude, phase-shifted from each other by 180 degrees and have a duty of 50%. As shown in FIGS. 11A to 11C, a bias voltage in a region of the charge transfer channel layer 917 directly beneath the floating gate 908 is reset to a bias voltage equal to a bias voltage to a reset drain 910 at a time T1. A reset gate 909 is closed at a time T2, and the signal charges accumulated in the portion of the charge transfer channel layer 917 region directly beneath the gate 907S are transferred to a charge transfer channel layer 917 region directly beneath the floating gate 908 at a time T3. Similarly to the first embodiment shown in FIG. 6, a predetermined DC voltage is applied to the output gate 919. Also, the DC bias from the DC bias voltage power supply 921 is set to a voltage such that the signal charges are accumulated in the charge transfer channel layer 917 region directly beneath the floating gate 908 at the time T3.

When the signal charges are transferred to the charge transfer channel layer 917 region directly beneath the floating gate 908, a voltage substantially proportional to the amount of signal charges is induced to the floating gate 908 via the coupling capacity between the signal charges and the floating gate 908. Then, the induced voltage is amplified and outputted by the buffer amplifier 905 to the external device as the output voltage. At this time, the signal charges are mixed with the charges already existing in the charge transfer channel layer 917 region directly beneath the floating gate 908. Thus, this charge detecting method is the destructively detecting method.

Advantageous effects of the charge transfer device in the second embodiment will be described below. Considering an alternate current (AC) component of the output from the amplifier 904, the AC component of the induced voltage to the floating gate 908 is applied to the bias gate 915 through the bias feedback circuit without attenuation of the voltage amplitude. Hence, the capacity between the floating gate 908 and the bias gate 915 can be apparently excluded or ignored. Moreover, the floating gate 908 is shielded without the overlap with the adjacent output gate 919 and reset gate 909. Also, the bias gate 915 is provided to cover the entire surface of the floating gate 908. Accordingly, the effect of electrically shielding the floating gate 908 is enhanced. Therefore, this results in the reduction of the parasitic capacitance in the floating gate 908 because of the coupling capacity between the floating gate 908 and the output gate 919 and the coupling capacity between the floating gate 908 and the reset gate 909.

Furthermore, the preset transistor 224 used in the conventional example as shown in FIG. 2 is not required. Thus, the increase of the parasitic capacitance because of the addition of the preset transistor can be eliminated. As a result, these advantageous effects can reduce the charge detection capacity by approximately 20% and equivalently improve the charge detection sensitivity by approximately 25%, as compared with the conventional technique of the type of adding the preset transistor 224.

It should be noted that the method of destructively detecting the charges is described in the second embodiment. However, even if the bias feedback circuit as explained in the second embodiment contains the amplifier, the charge transfer device can be modified to contain the transfer gates as in the first embodiment shown in FIG. 6. In this case, the non-destructive detection can be performed.

What is claimed is:

1. A charge transfer device comprising:
    a floating gate provided in an insulating film which is provided on a charge transfer channel layer;
    a buffer amplifier connected with said floating gate, for detecting signal charges in said charge transfer channel layer to generate a signal indicative of an output voltage corresponding to said signal charges;
    a bias gate provided in said insulating film apart from said floating gate to cover at least a part of said floating gate; and
    a bias applying unit for applying a bias voltage to said bias gate in response to said output voltage signal such that an alternate current (AC) component of a voltage of said floating gate is substantially equal to an AC component of a voltage of said bias gate, and
        wherein said bias applying unit comprises a direct current bias voltage power supply for outputting a direct current (DC) voltage, and a bias feedback circuit for applying to said bias gate said bias voltage in which said DC voltage is added to said output voltage of said buffer amplifier,
        wherein said bias feedback circuit comprises a capacitor connected between an output of said buffer amplifier and a first node, and a resistor connected between said DC bias voltage power supply and said first node, said first node being connected to said bias gate so that a voltage between said resistor and said capacitor is applied to said bias gate as said bias voltage.

2. A charge transfer device according to claim 1, wherein said bias feedback circuit further comprises an amplifier connected between the output of said buffer amplifier and said capacitor.

3. A charge transfer device according to claim 1, wherein said floating gate is arranged such that said floating gate does not overlap with a plurality of transfer gates, an output gate and a reset gate, in a direction perpendicular to said charge transfer direction.

4. A charge transfer device according to claim 1, further comprising transfer gate sets formed in said insulating film, composed of a plurality of transfer gates, for transferring said signal charges in response to a first clock signal and a second clock signal.

5. A charge transfer device according to claim 4, wherein said plurality of transfer gates are arranged in a transfer direction of said signal charges such that said plurality of transfer gates are not overlapped with each other in a direction perpendicular to said charge transfer direction.

6. A charge transfer device according to claim 4, wherein every adjacent two of said plurality of transfer gates constitute one of said transfer gate sets, and said first clock signal and said second clock signal which are complementary to each other are alternately supplied to the transfer gate sets.

7. A charge transfer device according to claim 4, further comprising a clock signal generator for supplying said first clock signal and said second clock signal which are complementary to each other.

8. A charge transfer device according to claim 1, wherein said charge transfer channel layer is an N-type buried channel, and includes an $N^{31}$ region formed under at least one of a plurality of transfer gates in said charge transfer channel layer.

9. A charge transfer device according to claim 1, further comprising a reset gate provided in said insulating film to control timing at which said signal charges are transferred from a region of said charge transfer channel layer under said floating gate to a reset drain.

10. A charge transfer device according to claim 9, further comprising a reset drain provided behind said reset gate in the charge transfer direction in said charge transfer channel layer by application of a direct current (DC) bias voltage to control timing at which said signal charges are transferred from a region of said charge transfer channel layer under said floating gate to said reset drain.

11. A charge transfer device according to claim 1, further comprising an output gate provided between said transfer gate sets and said floating gate in said insulating film to control timing at which said signal charges are transferred to a region of said charge transfer channel layer under said floating gate.

12. A charge transfer device comprising:
    a floating gate provided in an insulating film which is provided on a charge transfer channel layer;
    a buffer amplifier connected with said floating gate, for detecting signal charges in said charge transfer channel layer to generate a signal indicative of an output voltage corresponding to said signal charges;
    a bias gate provided in said insulating film apart from said floating gate to cover at least a part of said floating gate; and
    a bias applying unit for applying a bias voltage to said bias gate in response to said output voltage signal such that an alternate current (AC) component of a voltage of said floating gate is substantially equal to an AC component of a voltage of said bias gate,
    wherein said bias gate covers an entire surface of said floating gate other than a bottom surface thereof.

13. A method for transferring and detecting signal charges, comprising the steps of:
    transferring signal charges to a region of a charge transfer channel layer under a floating gate;
    applying a bias voltage to said bias gate, such that an alternate current (AC) component of a voltage of said floating gate is substantially equal to an AC component of a voltage of said bias gate;
    detecting said signal charges transferred in said charge transfer channel layer by use of said floating gate to generate an output signal; and
    controlling said bias voltage in response to said output signal,
        wherein said applying step includes the steps of,
        generating a direct current (DC) voltage,
        removing a DC component from said output signal to produce a DC component removed signal, and
        superimposing said DC component removed signal on said DC voltage to apply to said bias gate as said bias voltage.

14. A charge transfer device according to claim 13, wherein said applying step includes:

amplifying said output signal for reducing a parasitic capacitance between said floating gate and said bias gate;

removing a DC component from the amplified output signal to produce a DC component removed signal; and superimposing said DC component removed signal on said DC voltage, to apply to said bias gate as said bias voltage.

15. A charge transfer device according to claim 13, wherein said step of transferring said signal charges includes:

generating first and second clock signals which are complementary to each other; and responding to said first and second clock signals to transfer said signal charges.

16. A charge transfer device according to claim 15, wherein said first and second clock signals are applied to said transfer gate sets to form a well structure within said charge transfer channel layer, and said signal charge is transferred in accordance with said formed well structure.

17. A charge transfer device comprising:

a floating gate in an insulating film on a charge transfer channel layer;

a buffer amplifier connected to said floating gate;

a direct current bias voltage power supply;

a bias gate that is in said insulating film over a first surface of said floating gate opposite a second surface of said floating gate that faces said charge transfer channel layer; and a first node that is connected to said bias gate, to an output of said buffer amplifier through a capacitor, and to said direct current bias voltage power supply through a resistor.

* * * * *